US008987833B2

(12) United States Patent
McDonald et al.

(10) Patent No.: US 8,987,833 B2
(45) Date of Patent: Mar. 24, 2015

(54) STACKED COMPOSITE DEVICE INCLUDING A GROUP III-V TRANSISTOR AND A GROUP IV LATERAL TRANSISTOR

(75) Inventors: Tim McDonald, Redondo Beach, CA (US); Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/433,864

(22) Filed: Mar. 29, 2012

(65) Prior Publication Data

US 2012/0256188 A1 Oct. 11, 2012

Related U.S. Application Data

(60) Provisional application No. 61/473,907, filed on Apr. 11, 2011.

(51) Int. Cl.
*H01L 29/15* (2006.01)
*H01L 29/66* (2006.01)
(Continued)

(52) U.S. Cl.
CPC ............ *H01L 25/074* (2013.01); *H03K 17/567* (2013.01); *H01L 2224/48091* (2013.01); *H01L 2924/13091* (2013.01);
(Continued)

(58) Field of Classification Search
CPC ................... H01L 25/074; H01L 2924/30107; H01L 25/18; H01L 2924/13091; H01L 2924/00014; H01L 2924/00; H03K 17/567

USPC ........... 257/76, 195, 686, 724, 777, 200, 392, 257/E27.061, E29.089; 438/109, 172
See application file for complete search history.

(56) References Cited

U.S. PATENT DOCUMENTS 7,915,645 B2   3/2011 Briere
2003/0057459 A1*   3/2003 Rumennik .................... 257/288
(Continued)

FOREIGN PATENT DOCUMENTS

JP      S62-52954      3/1987
JP      H10-163333     6/1998
(Continued)

OTHER PUBLICATIONS

U.S. Appl. No. 61/448,617, filed Mar. 2, 2011, Lin.
(Continued)

*Primary Examiner* — Fernando L Toledo
*Assistant Examiner* — Aaron Gray
(74) *Attorney, Agent, or Firm* — Farjami & Farjami LLP (57) ABSTRACT

In one implementation, a stacked composite device comprises a group IV lateral transistor and a group III-V transistor stacked over the group IV lateral transistor. A drain of the group IV lateral transistor is in contact with a source of the group III-V transistor, a source of the group IV lateral transistor is coupled to a gate of the group III-V transistor to provide a composite source on a top side of the stacked composite device, and a drain of the group III-V transistor provides a composite drain on the top side of the stacked composite device. A gate of the group IV lateral transistor provides a composite gate on the top side of the stacked composite device, and a substrate of the group IV lateral transistor is on a bottom side of the stacked composite device.

20 Claims, 5 Drawing Sheets

(51) Int. Cl.
*H01L 27/088* (2006.01)
*H01L 23/02* (2006.01)
*H01L 23/48* (2006.01)
*H01L 23/52* (2006.01)
*H01L 29/40* (2006.01)
*H01L 21/338* (2006.01)
*H01L 25/07* (2006.01)
*H03K 17/567* (2006.01)
*H01L 25/18* (2006.01)

(52) U.S. Cl.
CPC ...... *H01L 2924/13055* (2013.01); *H01L 25/18* (2013.01); *H01L 2924/30107* (2013.01)
USPC ............. 257/392; 257/76; 257/195; 257/686; 257/777; 257/E27.061; 257/E29.089; 438/109; 438/172

(56) References Cited

U.S. PATENT DOCUMENTS

| | | |
|---|---|---|
| 2003/0151064 A1* | 8/2003 | Ohno et al. .................... 257/192 |
| 2003/0155644 A1 | 8/2003 | Hirao |
| 2005/0001235 A1 | 1/2005 | Murata |
| 2007/0262346 A1 | 11/2007 | Otremba |
| 2008/0191216 A1 | 8/2008 | Machida |
| 2009/0051043 A1 | 2/2009 | Wong |
| 2009/0057872 A1* | 3/2009 | Ehlers et al. ................... 257/698 |
| 2009/0108467 A1* | 4/2009 | Otremba ....................... 257/777 |
| 2009/0189191 A1 | 7/2009 | Sato |
| 2010/0140805 A1 | 6/2010 | Chang |
| 2010/0155932 A1 | 6/2010 | Gambino |
| 2011/0049580 A1* | 3/2011 | Lui et al. ....................... 257/262 |
| 2011/0136325 A1 | 6/2011 | Briere |
| 2011/0169549 A1* | 7/2011 | Wu ................................ 327/434 |
| 2012/0028436 A1 | 2/2012 | Or-Bach |
| 2012/0193785 A1 | 8/2012 | Lin |
| 2012/0256189 A1 | 10/2012 | McDonald |
| 2012/0256190 A1 | 10/2012 | McDonald |
| 2014/0035005 A1 | 2/2014 | Briere |

FOREIGN PATENT DOCUMENTS

| | | |
|---|---|---|
| JP | 2006-351691 | 12/2006 |
| JP | 2010-244977 | 10/2010 |
| JP | H 11-3916 | 1/2011 |
| WO | WO 2008/116038 | 9/2008 |

OTHER PUBLICATIONS

U.S. Appl. No. 61/448,347, filed Mar. 2, 2011, Lin.

\* cited by examiner

STACKED COMPOSITE DEVICE INCLUDING A GROUP III-V TRANSISTOR AND A GROUP IV LATERAL TRANSISTOR

The present application claims the benefit of and priority to a provisional application entitled "Group III-Nitride and Group IV Composite Device," Ser. No. 61/473,907 filed on Apr. 11, 2011. The disclosure in this provisional application is hereby incorporated fully by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride" or "III-N" refers to a compound semiconductor that includes nitrogen and at least one group III element including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar or non-polar crystal orientations. A III-Nitride material may also include either the Wurtzitic, Zincblende or mixed polytypes, and may include single-crystal, monoctystailine, polycrystalline, or amorphous structures.

Also as used herein, the phrase "group IV" refers to a semiconductor that includes at least one group four element including silicon (Si), germanium (Ge) and carbon (C), and also includes compound semiconductors such as silicon germanium (SiGe) and silicon carbide (SiC), for example. Group IV also refers to semiconductor materials which include more than one layer of group IV elements, or doping of group IV elements to produce strained group IV material, and may also include group IV based composite substrates such as silicon on insulstor (SOI), separation by implantation of oxygen (SIMOX) process substrates, and silicon on sapphire (SOS), for example.

II. Background Art

In high power and high performance circuit applications, III-Nitride transistors, such as gallium nitride (GaN) field-effect transistors (FETs) and high mobility electron transistors (HEMTs), are often desirable for their high efficiency and high-voltage operation. Moreover, it is often desirable to combine such HI-Nitride transistors with other FETs, such as silicon FETs, to create high performance composite switching devices.

In power management applications where normally OFF characteristics of power devices are desirable, a depletion mode (normally ON) III-Nitride transistor can be cascoded with an enhancement mode (normally OFF) low-voltage (LV) group IV semiconductor transistor, for example a silicon FET, to produce an enhancement mode (normally OFF) composite power device. However, conventional packaging techniques for combining HI-Nitride transistors with silicon FETs, for example, often counterweigh the benefits provided by III-Nitride devices. For instance, conventional package designs may place discrete components side-by-side on a common support surface implemented using a ceramic-based substrate such as a direct bonded copper (DBC) substrate, or a ceramic substrate on a lead-frame. Such side-by-side configuration can undesirably increase the parasitic inductance and resistance in the current paths of the composite power device, and would also increase the thermal dissipation requirements of the package. Moreover, the side-by-side placement of devices on a common substrate can undesirably increase package form factor, as well as manufacturing costs.

SUMMARY

The present disclosure is directed to a stacked composite device including a group III-V transistor and a group IV lateral transistor, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

III-Nitride materials include, for example, gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields, high saturation velocities, and the creation of two-dimensional electron gases (2DEGs). As a result, III-Nitride materials such as GaN are used in many microelectronic applications as depletion mode (e.g., normally ON) and enhancement mode (e.g., normally OFF) power field-effect transistors (FETs) and high electron mobility transistors (HEMTs), for example.

In power management applications where normally OFF characteristics of power devices are required, a depletion mode III-Nitride or other group III-V device can be cascoded with a low-voltage (LV) group IV semiconductor device to produce an enhancement mode composite power device. However, the utility and reliability of such a composite device can be compromised by conventional packaging techniques for combining III-Nitride transistors with LV FETs, which can often negate the benefits provided by III-Nitride devices. For example, and as noted above, conventional package designs may place discrete components side-by-side on a common support surface implemented using a ceramic-based substrate such as a direct bonded copper (DBC) substrate, or a ceramic substrate on a lead-frame. Such side-by-side configuration can undesirably increase the parasitic inductance and resistance in the current paths of the composite power device, and would also increase the thermal dissipation requirements of the package. Moreover, the side-by-side placement of devices on a common substrate can undesirably increase package form factor, as well as manufacturing costs. As a result, a compact and cost-effective packaging solution for integrating III-Nitride or other group III-V transistors with group IV FETs, such as silicon FETs, is needed.

One approach to providing the needed packaging solution is implemented by the vertical stacking of the silicon or other group IV active die on top of the III-Nitride or other group III-V active die, as disclosed in U.S. patent application Ser. No. 13/053,646, entitled "III-Nitride Transistor Stacked with Diode in a Package," filed on Mar. 22, 2011; as well as in U.S. patent application Ser. No. 13/053,556, entitled: "III-Nitride Transistor Stacked with FET in a Package," also filed on Mar. 22, 2011, both of which are hereby incorporated by reference in their entirety.

The present application is directed to a stacked composite device wherein the group III-V active die is stacked on top of a silicon or group IV active die having a lateral transistor formed therein. The present approach is motivated in part by the larger die size typically required for the bottom die. That is to say, by implementing the bottom (larger) active die of the composite device using a less expensive group IV material such as silicon, and stacking a smaller active die formed of a costlier group III-V material such as GaN over the smaller group IV active die, the present application discloses a compact, cost effective packaging solution advantageously providing the performance advantages enabled by group III-V transistors.

According to one implementation, the stacked composite device may include a III-Nitride power transistor cascoded with an LV group IV lateral transistor. The cascoded combination of the HI-Nitride power transistor, which may be a normally ON device, for example, with the LV group IV lateral transistor can be implemented to produce a normally OFF composite power device. Moreover, the composite device configurations disclosed by the present application are designed to substantially reduce parasitic inductance and resistance, and enhance thermal dissipation by a composite device package when compared to conventional integrated packaging solutions.

Figure 1:
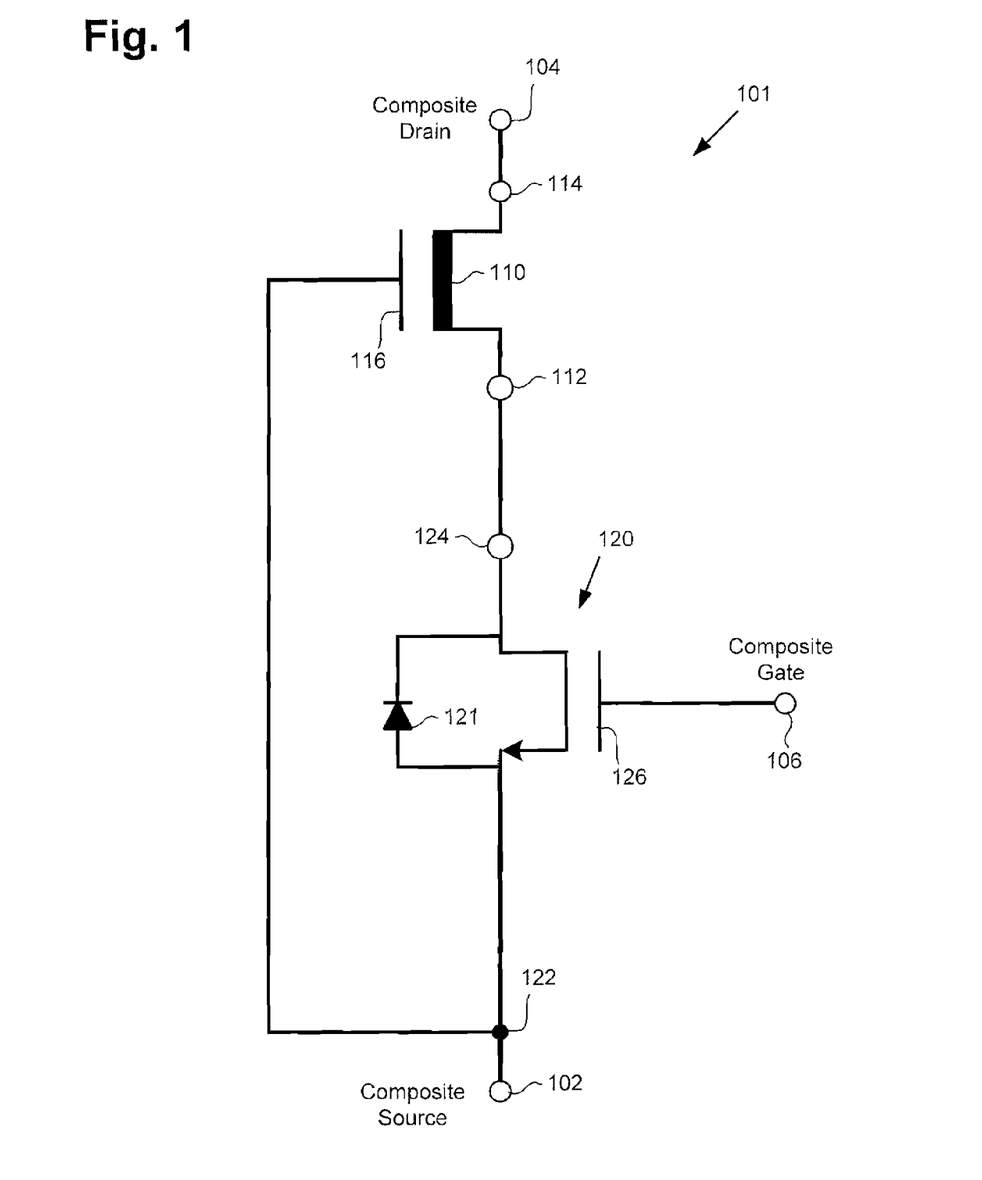
FIG. 1 presents a diagram representative of one exemplary implementation of a composite device.

Referring to FIG. 1, FIG. 1 shows one exemplary implementation of a composite device. As shown in FIG. 1, composite device 101 includes group III-V transistor 110 cascoded with group IV transistor 120. Also shown in FIG. 1 are composite source 102, composite drain 104, and composite gate 106 of composite device 101, as well as source 112, drain 114, and gate 116 of group III-V transistor 110, and body diode 121, source 122, drain 124, and gate 126 of group IV transistor 120.

Group III-V transistor 110 may be a III-Nitride power transistor and may be implemented as an insulated-gate FET (IGFET), or as a heterostructure FET (HFET), for example. In one implementation, group III-V transistor 110 may take the form of a metal-insulator-semiconductor FET (MISFET), such as a metal-oxide-semiconductor FET (MOSFET). Alternatively, when implemented as an HFET, group III-V transistor 110 may be a HEMT configured to produce a 2DEG. According to one implementation, for example, group III-V transistor 110 may be a high-voltage (HV) device configured to sustain a drain voltage of approximately 600V and having a gate rating of approximately 40V. It is noted that in some implementations, composite device 101 may utilize an insulated gate bipolar transistor (IGBT) as a power transistor in place of a group III-V FET or HEMT. It is further noted that composite device 101 may utilize a group III-V FET or HEMT other than a III-N FET or HEMT, such as a III-As, III-P or III-$As_aP_bN_{(1-a-b)}$ FET or HEMT, for example, as group III-V transistor 110.

Group IV transistor 120 may be implemented as an LV group IV lateral transistor, such as a silicon lateral transistor having a breakdown voltage of approximately 25V, for example. According to one implementation, group IV transistor 120 may be a silicon lateral MISFET or MOSFET, for example. However, in other implementations, group IV transistor 120 may include any suitable group IV material, such as silicon carbide (SiC), germanium (Ge), silicon germanium (SiGe), or a strained group IV element or compound, for example.

The cascoded combination of group III-V transistor 110 and group IV transistor 120 produces composite device 101, which according to the implementation shown in FIG. 1 results in a composite three terminal device functioning in effect as a composite transistor having composite source 102 and composite gate 106 provided by group IV transistor 120, and composite drain 104 provided by group III-V transistor 110. Moreover, and as will be described in greater detail by reference to the exemplary implementations discussed below, composite device 101 may be configured so as to be contained by a compact package having reduced parasitic inductance and resistance, and enhanced thermal dissipation.

Figure 2A:
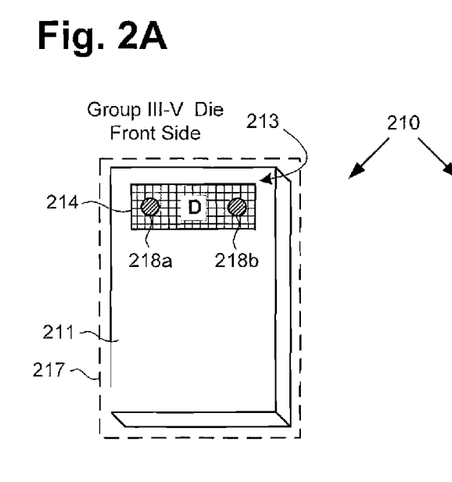
FIG. 2A presents a perspective view showing a front side of an exemplary group III-V transistor suitable for use in a stacked composite device, according to one implementation.
Figure 2B:
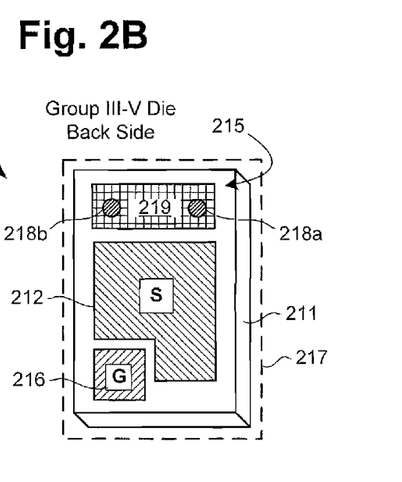
FIG. 2B presents a perspective view showing a back side of the exemplary group III-V transistor shown in FIG. 2A.

Continuing to FIGS. 2A and 2B, FIG. 2A presents a perspective view showing front side 213 of exemplary group III-V transistor 210 suitable for use in a stacked composite device, according to one implementation, while FIG. 2B presents a perspective view showing back side 215 of group III-V transistor 210. As shown by FIG. 2A, group III-V transistor 210 includes active die 211 having lateral area 217 and including drain electrode 214 formed on front side 213 of active die 211. Also shown in FIG. 2A are front side termini of through-substrate vias 218a and 218b electrically coupling drain electrode 214 to drain pad 219 on back side 215 of active die 211 (drain pad 219 and respective corresponding back side termini of through-substrate vias 218a and 218b shown in FIG. 2B). As further shown by FIG. 2B, source electrode 212, gate electrode 216, and drain pad 219 including back side termini of through-substrate vias 218a and 218b are formed on back side 215 of active die 211. It is noted that although the front side termini of through-substrate vias 218a and 218b are visually depicted as "seen through" drain electrode 214 in the interests of conceptual clarity, in practice the front side termini of through-substrate vias 218a and 218b would be obscured by the presence of drain electrode 214 and thus would not be visible from the perspective view shown by FIG. 2A. Similarly, the back side termini of through-substrate vias 218a and 218b visually depicted as "seen through" drain pad 219 on back side 215 of active die 211 would be obscured by the presence of drain pad 219 and thus would not be visible from the perspective view shown by FIG. 2B.

Active die 211 may be formed of a III-Nitride material, for example, and may be implemented as a HEMT power device. As noted above, drain pad 219 is coupled to drain electrode 214 by through-substrate vias 218a and 218b. Group III-V transistor 210 having source electrode 212, drain electrode 214, and gate electrode 216 corresponds to group III-V transistor 110 having source 112, drain 114, and gate 116, in FIG. 1, and may share any of the characteristics previously attributed to that corresponding device above.

Figure 3:
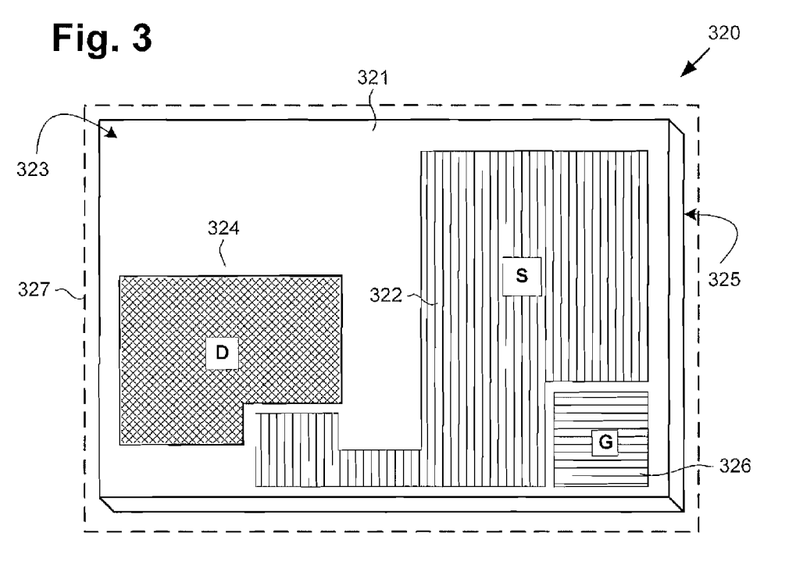
FIG. 3 presents a perspective view showing a top side of an exemplary group IV lateral transistor suitable for use in a stacked composite device, according to one implementation.

Moving to FIG. 3, FIG. 3 presents a perspective view showing top side 323 of exemplary group IV lateral transistor 320 suitable for use in a stacked composite device, according to one implementation. As shown by FIG. 3, group IV lateral transistor 320 includes active die 321, which may be formed of any suitable group IV semiconductor, and includes source electrode 322, drain electrode 324, and gate electrode 326 on top side 323 of active die 321. Group IV lateral transistor 320 may be implemented as a group IV lateral FET, such as a silicon lateral FET, for example. Also represented in FIG. 3 are substrate 325 of group IV lateral transistor 320 on a bottom side of active die 321 opposite top side 323, and lateral area 327 of active die 321. It is noted that lateral area 327 of active die 321 is greater than lateral area 217 of active die 211, in FIGS. 2A and 2B.

Figure 4:
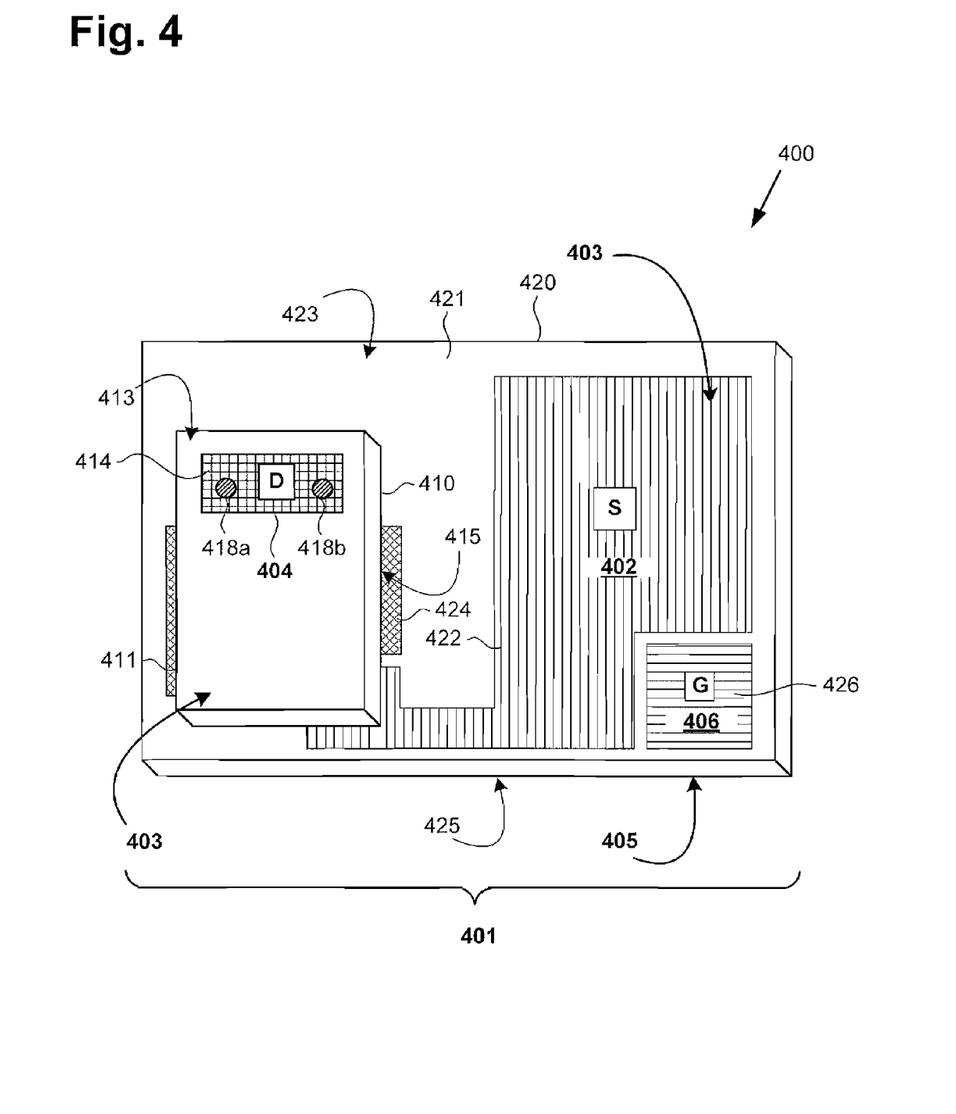
FIG. 4 presents a perspective view showing a top side of an exemplary stacked composite device implemented using the transistors shown by FIGS. 2A, 2B, and 3.

Referring now to FIG. 4, FIG. 4 presents a perspective view showing a top side of a packaging solution including an exemplary stacked composite device, according to one implementation. As shown in FIG. 4, composite device package 400 includes stacked composite device 401 formed from group III-V transistor 410 stacked over and cascoded with group IV lateral transistor 420. Stacked composite device 401 corresponds to composite device 101, in FIG. 1. In addition, group III-V transistor 410 including active die 411 having back side 415, and drain electrode 414 including front side termini of through-substrate vias 418a and 418b on front side 413, corresponds to group III-V transistor 210, in FIGS. 2A and 2B. Consequently, the front side termini of through-substrate vias 418a and 418b depicted as "seen through" drain electrode 414 would in fact not be visible from the perspective of FIG. 4 due to their being overlaid by drain electrode 414. Moreover, group IV lateral transistor 420 including active die 421 having source electrode 422, drain electrode 424, and gate electrode 426 on top side 423 of active die 421, and substrate 425 at bottom side 405 of stacked composite device 401, corresponds to group IV lateral transistor 320, in FIG. 3. It is further noted that insofar as group III-V transistor 410 corresponds to group III-V transistor 210 and group IV lateral transistor 420 corresponds to group IV lateral transistor 320, active die 421 of group IV lateral transistor 420 has a lateral area greater than a lateral area of active die 411 of group III-V transistor 410, as depicted in FIG. 4.

Stacked composite device 401 includes composite source electrode 402, composite drain electrode 404, and composite gate electrode 406, corresponding respectively to composite source 102, composite drain 104, and composite gate 106 of composite device 101, in FIG. 1. As shown in FIG. 4, stacked composite device 401 includes group IV lateral transistor 420 and group III-V transistor 410 stacked over group IV lateral transistor 420. According to the implementation shown in FIG. 4, drain electrode 424 of group IV lateral transistor 420 is in contact with a source electrode on back side 415 of active die 411 (corresponding to source electrode 212 of group III-V transistor 210, in FIG. 2B). In addition, source electrode 422 of group IV lateral transistor 420 is coupled to a gate electrode on back side 415 of active die 411 (corresponding to gate electrode 216 of group III-V transistor 210, in FIG. 2B) to provide composite source electrode 402 on top side 403 of stacked composite device 401. Moreover, drain electrode 414 of group III-V transistor 410 provides composite drain electrode 404 on top side 403 and gate electrode 426 of group IV lateral transistor 420 provides composite gate electrode 406 on top side 403, while substrate 425 of group IV lateral transistor 420 is on bottom side 405 of stacked composite device 420.

In FIG. 4, stacked composite device 401 may be formed by stacking back side 415 of group III-V transistor 410 directly on top of drain electrode 424 of group IV lateral transistor 420, for example. In that implementation, active die 411 can be aligned such that the source electrode of group III-V transistor 410 makes direct contact with drain electrode 424 of group IV lateral transistor 420, and such that the gate electrode of group III-V transistor 410 makes direct contact with source electrode 422 of group IV lateral transistor 420 to provide composite source electrode 402. In this implementation, composite source electrode 402 needs to be sufficiently isolated from drain electrode 424 of group IV lateral transistor 420.

Stacking of group III-V transistor 410 on top of group IV lateral transistor 420 may be achieved using, for example, solder, conductive adhesive, conductive tape, sintering, or other attachment methods, resulting in formation of a direct mechanical contact between group IV lateral transistor 420 and group III-V transistor 410. Such direct attachment of group IV lateral transistor 420 to group III-V transistor 410 can advantageously reduce parasitic inductance and resistance, improve thermal dissipation, and reduce form factor and manufacturing cost compared to conventional packaging solutions. To improve thermal dissipation even further, active die 411 of group III-V transistor 410 and/or active die 421 of group IV lateral transistor 420 may be thinned so as to have a die thickness in a range from approximately thirty microns (30 μm) to approximately 60 μm to enhance thermal conductivity.

With respect to the exemplary stacked composite device implementation shown in FIG. 4, the present inventors emphasize that the features and characteristics represented by that specific example are depicted in detail merely as a conceptual aid, and are not to be interpreted as limitations. It is noted that implementational details such as dimensions, and device layouts, for example, may be highly dependent upon the particular devices being utilized and the particular purpose for which the stacked composite device is designed. Consequently, the inventive principles illuminated by the specific example shown by FIG. 4 are capable of considerable implementational variation without departing from the scope of the inventive concepts disclosed herein.

Figure 5A:
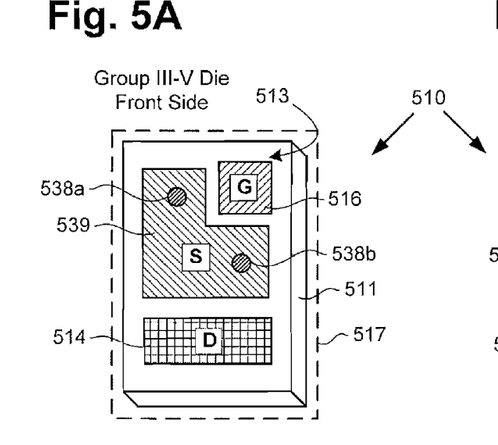
FIG. 5A presents a perspective view showing a front side of an exemplary group III-V transistor suitable for use in a stacked composite device, according to another implementation.
Figure 5B:
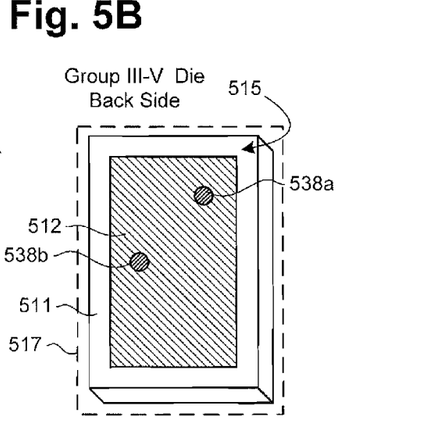
FIG. 5B presents a perspective view showing a back side of the exemplary group III-V transistor shown in FIG. 5A.

Continuing to FIGS. 5A and 5B, FIG. 5A presents a perspective view showing front side 513 of exemplary group III-V transistor 510 suitable for use in a stacked composite device, according to another implementation, while FIG. 5B presents a perspective view showing back side 515 of group III-V transistor 510. As shown by FIG. 5A, group III-V transistor 510 includes active die 511 having lateral area 517, and having drain electrode 514, gate electrode 516, and source pad 539 formed on front side 513 of active die 511. Also shown in FIG. 5A are front side termini of through-substrate vias 538a and 538b electrically coupling source pad 539 to source electrode 512 on back side 515 of active die 511

(source electrode 512 and respective corresponding back side termini of through-substrate vias 538a and 538b shown in FIG. 5B). As further shown by FIG. 5B, source electrode 512 of group III-V transistor 510 is formed on back side 515 of active die 511. It is noted that although the front side termini of through-substrate vias 538a and 538b are visually depicted as "seen through" source pad 539 in the interests of conceptual clarity, in practice the front side termini of through-substrate vias 538a and 538b would be obscured by the presence of source pad 539 and thus would not be visible from the perspective view shown by FIG. 5A. Similarly, the back side termini of through-substrate vias 538a and 538b visually depicted as "seen through" source electrode 512 on back side 515 of active die 511 would be obscured by the presence of source electrode 512 and thus would not be visible from the perspective view shown by FIG. 5B.

Active die 511 may be formed of any suitable III-Nitride material. Group III-V transistor 510 having source electrode 512, drain electrode 514, and gate electrode 516 corresponds to group III-V transistor 110 having source 112, drain 114, and gate 116, in FIG. 1, and may share any of the characteristics previously attributed to that corresponding device above.

Figure 6:
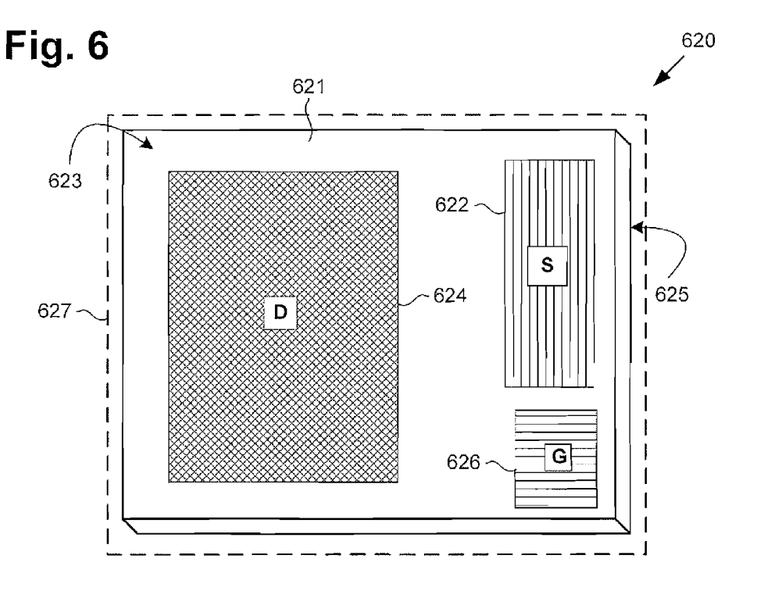
FIG. 6 presents a perspective view showing a top side of an exemplary group IV lateral transistor suitable for use in a stacked composite device, according to one implementation.

Moving to FIG. 6, FIG. 6 presents a perspective view showing top side 623 of exemplary group IV lateral transistor 620 suitable for use in a stacked composite device, according to one implementation. As shown by FIG. 6, group IV lateral transistor 620 includes active die 621, which may be formed of any suitable group IV semiconductor, having source electrode 622, drain electrode 624, and gate electrode 626 on top side 623 of active die 621. As depicted in FIG. 6, group IV lateral transistor 620 may be implemented as a group IV lateral FET, such as a silicon lateral FET, for example. Also represented in FIG. 6 are substrate 625 of group IV lateral transistor 620 on a bottom side of active die 621 opposite top side 623, and lateral area 627 of active die 621. It is noted that lateral area 627 of active die 621 is greater than lateral area 617 of active die 611, in FIGS. 6A and 6B.

Figure 7:
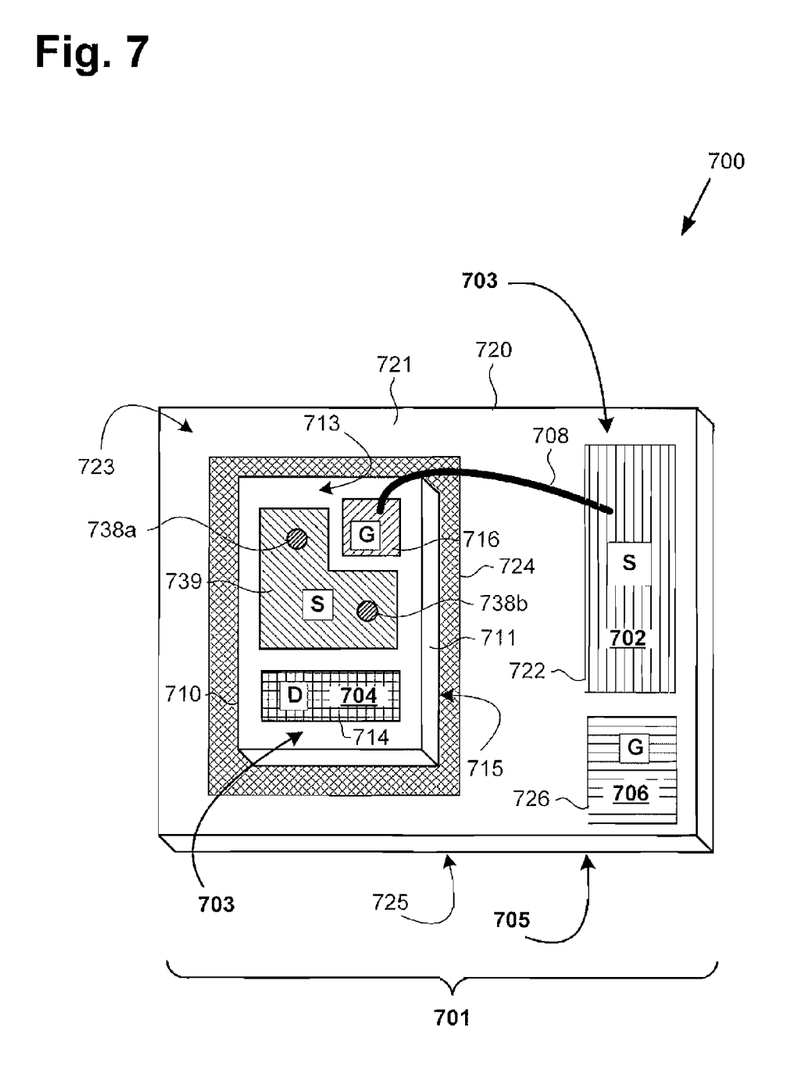
FIG. 7 presents a perspective view showing a top side of an exemplary stacked composite device implemented using the transistors shown by FIGS. 5A, 5B, and 6.

Referring now to FIG. 7, FIG. 7 presents a perspective view showing a top side of a packaging solution including an exemplary stacked composite device, according to one implementation. As shown in FIG. 7, composite device package 700 includes stacked composite device 701 formed from group III-V transistor 710 stacked over and cascoded with group IV lateral transistor 720. Stacked composite device 701 corresponds to composite device 101, in FIG. 1. In addition, group III-V transistor 710 including active die 711 having back side 715, and drain electrode 714, gate electrode 716, and source pad 739 including front side termini of through-substrate vias 738a and 738b on front side 713, corresponds to group III-V transistor 510, in FIGS. 5A and 5B. Consequently, the front side termini of through-substrate vias 738a and 738b depicted as "seen through" source pad 739 would in fact not be visible from the perspective of FIG. 7 due to their being overlaid by source pad 739. Moreover, group IV lateral transistor 720 having source electrode 722, drain electrode 724, and gate electrode 726 on top side 723 of active die 721, and substrate 725 at bottom side 705 of composite device package 700, corresponds to group IV lateral transistor 620, in FIG. 6. It is further noted that insofar as group III-V transistor 710 corresponds to group III-V transistor 510 and group IV lateral transistor 720 corresponds to group IV lateral transistor 520, active die 721 of group IV lateral transistor 720 has a lateral area greater than a lateral area of active die 711 of group III-V transistor 710, as depicted in FIG. 7.

Composite device package 700 includes composite source 702 electrode, composite drain 704 electrode, and composite gate electrode 706, corresponding respectively to composite source 102, composite drain 104, and composite gate 106 of composite device 101, in FIG. 1. As shown in FIG. 7, composite device package 700 includes group IV lateral transistor 720 and group III-V transistor 710 stacked over group IV lateral transistor 720. According to the implementation shown in FIG. 7, drain electrode 724 of group IV lateral transistor 720 is in contact with a source electrode on back side 715 of active die 711 (corresponding to source electrode 512 of group III-V transistor 510, in FIG. 5B) and is thus electrically connected to source pad 739 by through-substrate vias 738a and 738b. In addition, source electrode 722 of group IV lateral transistor 720 is coupled to gate electrode 716 on front side 713 of active die 711 by one or more bond wires 708 to provide composite source electrode 702 on top side 703 of composite device package 700. Moreover, drain electrode 714 of group III-V transistor 710 provides composite drain electrode 704 on top side 703 and gate electrode 726 of group IV lateral transistor 720 provides composite gate electrode 706 on top side 703, while substrate 725 of group IV lateral transistor 720 is on bottom side 705 of composite device package 700.

Stacked composite device 701 may be formed by stacking the source electrode at back side 715 of group III-V transistor 710 directly on top of drain electrode 724 of group IV lateral transistor 720. Although in the present implementation, gate electrode 716 of group III-V transistor is shown to be coupled to source electrode 722 of group IV lateral transistor 720 through one or more bond wires 708, such as gold (Au) or copper (Cu) bond wires, for example, in other implementations one or more bond wires 708 may be replaced by conductive ribbons, conductive metal clips, or other connectors comprising conductive materials such as Al, Au, Cu, and/or other metals or composite materials. As was explained above by analogy in reference to FIG. 4, in implementations in which thermal dissipation is a priority, active die 711 of group III-V transistor 710 and/or active die 721 of group IV lateral transistor 720 may be thinned so as to have a die thickness in a range from approximately 30 μm to approximately 60 μm to enhance thermal conductivity. Moreover, it is reiterated that the features and characteristics represented by the specific example shown in FIG. 7 are depicted in detail merely as a conceptual aid, and are not to be interpreted as limitations.

Thus, by stacking a group III-V transistor over a group IV lateral transistor having a larger lateral area to form a stacked composite device, the implementations disclosed in the present application provide packaging solutions with a reduced form factor, as well as reduced cost. In addition, stacking of the group III-V transistor over the group IV lateral transistor can advantageously reduce parasitic inductance and resistance, and enhance thermal dissipation (which can be further enhanced by thinning of the group III-V and/or group IV active dies) so as to enable improved performance by the stacked composite device.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A stacked composite device having a composite drain, a composite source, and a composite gate, said stacked composite device comprising:
   a group IV lateral transistor;
   a group III-V transistor stacked over said group IV lateral transistor;
   a drain electrode of said group IV lateral transistor being in direct contact with a source electrode of said group III-V transistor, said source electrode of said group III-V transistor situated on said drain electrode of said group IV lateral transistor;
   a source of said group IV lateral transistor being coupled to a gate of said group III-V transistor to provide said composite source on a top side of said stacked composite device;
   a drain of said group III-V transistor providing said composite drain on said top side of said stacked composite device;
   a gate of said group IV lateral transistor providing said composite gate on said top side of said stacked composite device;
   a substrate of said group IV lateral transistor being on a bottom side of said stacked composite device;
   one of a drain electrode of said group III-V transistor and said source electrode of said group III-V transistor being electrically coupled to a respective drain or source pad on an opposite side of said group III-V transistor by at least one through-substrate via.

2. The stacked composite device of claim 1, wherein said group III-V transistor is a normally ON device and said stacked composite device is a normally OFF device.

3. The stacked composite device of claim 1, wherein said group III-V transistor is a high'-voltage transistor.

4. The stacked composite device of claim 1, wherein said group III-V transistor is a III-Nitride transistor.

5. The stacked composite device of claim 1, wherein said group IV lateral transistor is a low-voltage transistor.

6. The stacked composite device of claim 1, wherein at least one of a die of said group IV lateral transistor and a die of said group III-V transistor has a thickness of less than approximately 60 µm.

7. The stacked composite device of claim 1, wherein said group IV lateral transistor comprises silicon.

8. The stacked composite device of claim 1, wherein said source of said group IV lateral transistor is coupled to said gate of said group III-V transistor through at least one bond wire.

9. A composite device package comprising:
   a group IV lateral transistor in a first active die;
   a group III-V transistor stacked over said group IV lateral transistor in a second active die, a lateral area of said first active die being greater than a lateral area of said second active die;
   a drain electrode of said group IV lateral transistor being in direct contact with a source electrode of said group III-V transistor, said source electrode of said group III-V transistor situated on said drain electrode of said group IV lateral transistor;
   a source of said group IV lateral transistor being coupled to a gate of said group III-V transistor to provide a composite source on a top side of said composite device package;
   a drain of said group III-V transistor providing a composite drain on said top side of said composite device package;
   a gate of said group IV lateral transistor providing a composite gate on said top side of said composite device package;
   a substrate of said group IV lateral transistor being on a bottom side of said composite device package;
   one of a drain electrode of said group III-V transistor and said source electrode of said group III-V transistor being electrically coupled to a respective drain or source pad on an opposite side of said second active die by at least one through-substrate via.

10. The composite device package of claim 9, wherein said group III-V transistor is a normally ON device and a composite device formed of said group III-V transistor and said group IV lateral transistor is a normally OFF device.

11. The composite device package of claim 9, wherein said group III-V transistor is a high-voltage transistor and said group IV lateral transistor is a low-voltage transistor.

12. The composite device package of claim 9, wherein said group III-V transistor is a III-Nitride transistor.

13. The composite device package of claim 9, wherein at least one of said first active die and said second active die has a thickness of less than approximately 60 µm.

14. The composite device package of claim 9, wherein said group IV lateral transistor comprises silicon.

15. The composite device package of claim 9, wherein said source of said group IV lateral transistor is coupled to said gate of said group III-V transistor through at least one bond wire.

16. A stacked composite device having a composite drain, a composite source, and a composite gate, said stacked composite device comprising:
   a silicon lateral FET;
   a III-Nitride transistor stacked over said silicon lateral FET;
   a drain electrode of said silicon lateral FET being in direct contact with a source electrode of said III-Nitride transistor, said source electrode of said III-Nitride transistor situated on said drain electrode of said silicon lateral FET;
   a source of said silicon lateral FET being coupled to a gate of said III-Nitride transistor to provide said composite source on a top side of said stacked composite device;
   a drain of said III-Nitride transistor providing said composite drain on said top side of said stacked composite device;
   a gate of said silicon lateral FET providing said composite gate on said top side of said stacked composite device;
   a substrate of said silicon lateral FET being on a bottom side of said stacked composite device;
   one of a drain electrode of said III-Nitride transistor and said source electrode of said III-Nitride transistor being electrically coupled to a respective drain or source pad on an opposite side of said III-Nitride transistor by at least one through-substrate via.

17. The stacked composite device of claim 16, wherein said III-Nitride transistor is a normally ON device and said stacked composite device is a normally OFF device.

18. The stacked composite device of claim 16, wherein said III-Nitride transistor is a high-voltage transistor and said silicon lateral FET is a low-voltage transistor.

19. The stacked composite device of claim 16, wherein said III-Nitride transistor comprises gallium nitride (GaN).

20. The stacked composite device of claim 16, wherein said source of said silicon lateral FET is coupled to said gate of said III-Nitride transistor through at least one bond wire.

* * * * *